(12) United States Patent
Okazaki et al.

(10) Patent No.: US 7,138,665 B2
(45) Date of Patent: Nov. 21, 2006

(54) LIGHT EMITTING ELEMENT, METHOD OF MANUFACTURING THE SAME, AND SEMICONDUCTOR DEVICE HAVING LIGHT EMITTING ELEMENT

(75) Inventors: Haruhiko Okazaki, Yokohama (JP); Hideto Sugawara, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 164 days.

(21) Appl. No.: 10/946,787

(22) Filed: Sep. 22, 2004

(65) Prior Publication Data

US 2005/0051786 A1 Mar. 10, 2005

Related U.S. Application Data

(60) Division of application No. 10/417,873, filed on Apr. 17, 2003, now Pat. No. 6,825,502, which is a continuation of application No. 09/893,925, filed on Jun. 27, 2001, now abandoned.

(30) Foreign Application Priority Data

Jun. 30, 2000 (JP) ............................. 2000-200298

(51) Int. Cl.
*H01L 33/00* (2006.01)
(52) U.S. Cl. .......................... 257/98; 257/99
(58) Field of Classification Search ................ 257/79, 257/81, 85, 87, 91, 98–99
See application file for complete search history.

(56) References Cited

U.S. PATENT DOCUMENTS

| | | | | |
|---|---|---|---|---|
| 4,510,514 A | | 4/1985 | Camlibel et al. .............. 357/17 |
| 5,578,162 A | * | 11/1996 | D'Asaro et al. ............... 257/85 |
| 5,625,202 A | * | 4/1997 | Chai ............................ 257/94 |
| 5,854,088 A | | 12/1998 | Plals et al. ..................... 438/39 |
| 5,977,566 A | * | 11/1999 | Okazaki et al. ............... 257/99 |
| 5,990,500 A | * | 11/1999 | Okazaki ........................ 257/99 |
| 6,169,297 B1 | | 1/2001 | Jang et al. ..................... 257/99 |
| 6,310,364 B1 | * | 10/2001 | Uemura ...................... 257/100 |
| 6,521,914 B1 | * | 2/2003 | Krames et al. ............... 257/81 |
| 2005/0001227 A1 | * | 1/2005 | Niki et al. .................... 257/98 |
| 2005/0104080 A1 | * | 5/2005 | Ichihara et al. ............... 257/98 |

FOREIGN PATENT DOCUMENTS

| | | |
|---|---|---|
| DE | 199 21 987 | 11/1999 |
| EP | 0 926 744 | 6/1999 |
| JP | 08-64872 | 3/1996 |
| JP | 08-288551 | 11/1996 |
| JP | 11-008410 | 1/1999 |
| JP | 11-191641 | 7/1999 |
| JP | 11-229168 | 8/1999 |
| JP | 11-298040 | 10/1999 |
| JP | 2000-164928 | 6/2000 |
| WO | 01/47038 | 6/2001 |

* cited by examiner

*Primary Examiner*—Zandra V. Smith
*Assistant Examiner*—Tsz Chiu
(74) *Attorney, Agent, or Firm*—Hogan & Hartson LLP

(57) ABSTRACT

An InGaN active layer is formed on a sapphire substrate. A p-side electrode is formed on the InGaN active layer to supply an electric current to this InGaN active layer. The p-side electrode includes ① an Ni layer for forming an ohmic contact with a p-GaN layer, ② an Mo layer having a barrier function of preventing diffusion of impurities, ③ an Al layer as a high-reflection electrode, ④ a Ti layer having a barrier function, and ⑤ an Au layer for improving the contact with a submount on a lead frame. The p-side electrode having this five-layered structure realizes an ohmic contact and high reflectance at the same time.

20 Claims, 12 Drawing Sheets

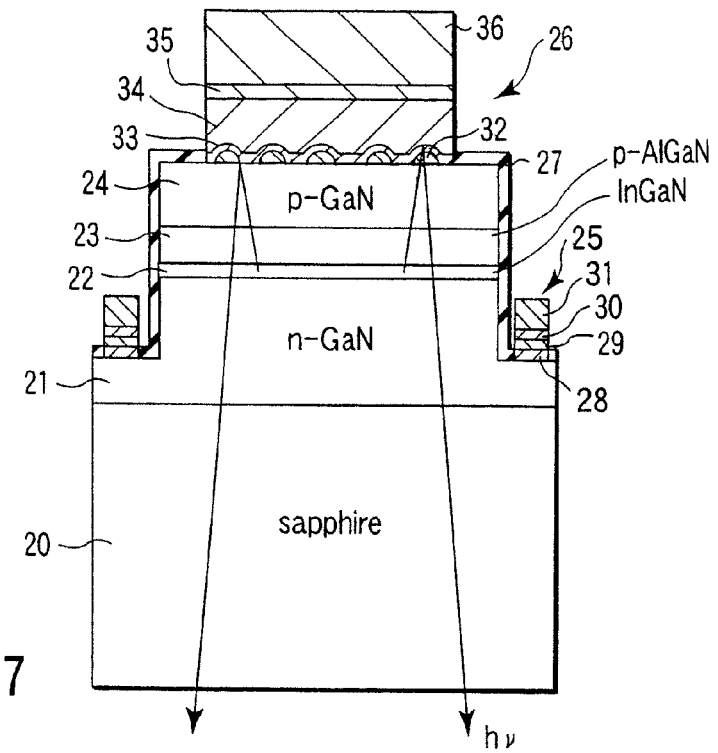
F I G. 17
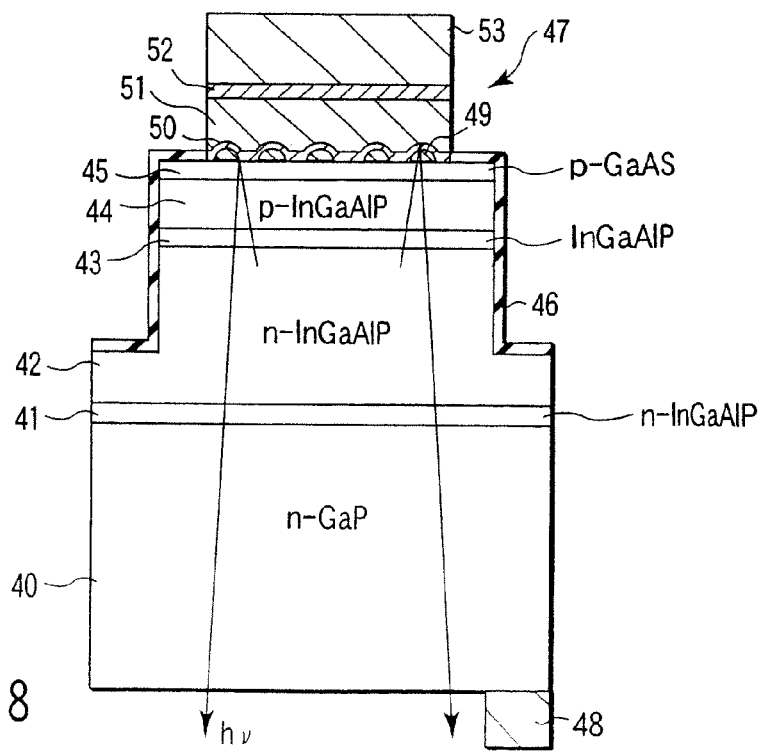
F I G. 18

LIGHT EMITTING ELEMENT, METHOD OF MANUFACTURING THE SAME, AND SEMICONDUCTOR DEVICE HAVING LIGHT EMITTING ELEMENT

This is a divisional of application Ser. No. 10/417,873, filed Apr. 17, 2003, now U.S. Pat. No. 6,825,502 which is a continuation of application Ser. No. 09/893,925, filed Jun. 27, 2001, now abandoned, which applications are hereby incorporated by reference in their entirety.

CROSS-REFERENCE TO RELATED APPLICATIONS

This application is based upon and claims the benefit of priority from the prior Japanese Patent Application No. 2000-200298, filed Jun. 30, 2000, the entire contents of which are incorporated herein by reference.

BACKGROUND OF THE INVENTION

1. Field of the Invention

The present invention relates to a light emitting element and, more particularly, to the electrode structure of a light emitting element.

2. Description of the Related Art

The recent progress of light emitting elements is remarkable. In particular, small-sized, low-power-consumption, high-reliability light emitting diodes (LEDs) are developed and extensively used as display light sources.

Red, orange, yellow, and green LEDs currently put to practical use are made of group III–V compound semiconductors using As and P as group V elements, e.g., AlGaAs, GaAlP, GaP, and InGaAlP. On the other hand, green, blue, and ultraviolet LEDs are made of compound semiconductors such as GaN. In this way, LEDs having high emission intensity are realized.

When the luminance of these LEDs is increased, applications such as outdoor display devices and communication light sources are presumably greatly extended.

FIG. 1 shows the structure of a conventional violet LED.

A light emitting element 110 for emitting violet light is bonded on a lead frame 120 by silver paste 130. The p- and n-electrodes of this light emitting element 110 are connected to the lead frame 120 by bonding wires 150. The light emitting element 110 is covered with an epoxy resin 180.

FIG. 2 shows the light emitting element shown in FIG. 1.

On a sapphire ($Al_2O_3$) substrate 200, an n-GaN layer 210 and a p-GaN layer 220 are formed. The n-GaN layer 210 has a recess. Since the p-GaN layer 220 is not present on this recess, the n-GaN layer 210 is exposed in this recess of the n-GaN layer 210.

An n-side electrode 230 is formed on the recess of the n-GaN layer 210. A transparent electrode 240 having properties of transmitting light is formed on the p-GaN layer 220. In addition, a bonding electrode 250 for wire bonding is formed on the p-GaN layer 220.

When a voltage is applied between the two lead frames 120 in the LED shown in FIGS. 1 and 2, an electric current is injected into the p-GaN layer 220 from the bonding electrode. 250 and the transparent electrode 240. This electric current flows from the p-GaN layer 220 to the n-GaN layer 210.

In the boundary (p-n junction) between the p-GaN layer 220 and the n-GaN layer 210, light having energy hv (h: Planck's constant, $v=c/\lambda$, c: velocity of light, $\lambda$: wavelength) is generated when the electric current flows. This light is emitted upward from the transparent electrode 240.

In the transparent electrode 240, however, the light transmittance and the conductivity have a relationship of trade-off.

That is, to increase the light transmittance, the thickness of the electrode need only be decreased. However, if the electrode thickness is decreased, the conductivity lowers. When the conductivity lowers, no electric current can be supplied to the whole p-n junction any longer and this decreases the light generation efficiency. Also, to increase the conductivity, the thickness of the electrode need only be increased. However, if the electrode thickness is increased, the light transmittance lowers. When the light transmittance lowers, light generated in the p-n junction cannot be efficiently extracted to the outside of the chip.

As a technology by which this problem is solved, a technology of emitting light toward the sapphire substrate 200 is known.

FIG. 3 shows a light emitting element using this technology.

Since this light emitting element is bonded on a lead frame by flip chip bonding, an LED having this light emitting element is called a flip chip type LED.

A high-reflectance electrode 260 is formed on p-GaN 220. Of light generated in the p-n junction, light traveling to a sapphire substrate 200 is directly emitted to the outside of the chip. Of light generated in the p-n junction, light heading to the electrode 260 is reflected by this electrode 260. The reflected light travels to the sapphire substrate 200 and is emitted to the outside of the chip.

The sapphire substrate 200 will be described below.

When InGaN is used as an active layer, an LED currently put to practical use emits light within the range of blue to green. The bandgap of the sapphire substrate 200 is approximately 3.39 eV (wavelength $\lambda \approx 365$ nm) at room temperature (300K). That is, the sapphire substrate 200 has properties of transmitting light within the range of blue to green (the wavelength $\lambda$ is approximately 400 to 550 nm).

A flip chip type LED is very effective as a technology of extracting light to the outside of the chip with high efficiency, but also has a problem.

That is, it is generally difficult to form an ohmic contact with the p-GaN 220 when the high-reflectance electrode 260 is used. This ohmic contact is an essential technology to reduce the contact resistance between the electrode 260 and the p-GaN 220 and thereby improve the performance of the element.

Conventionally, therefore, the electrode 260 is given a two-layered structure including an ohmic layer for forming an ohmic contact and a high-reflection layer having high reflectance. The ohmic layer improves the performance and the high-reflection layer increases the light emission efficiency at the same time.

Unfortunately, the ohmic layer obtains an ohmic contact by interdiffusion of metal atoms between this ohmic layer and the p-GaN 220, so these metal atoms naturally diffuse from the ohmic layer to the high-reflection layer. Since this diffusion lowers the performance and reliability of the light emitting element, it must be eliminated.

FIG. 4 shows an LED made of group III–V compound semiconductors having As and P as group V elements.

This LED emits light within the range of red to green.

On an n-GaAs substrate 300, an n-GaAs buffer layer 310 and an n-InGaAlP cladding layer 320 are formed. On this n-InGaAlP cladding layer 320, an InGaAlP active layer 330, a p-InGaAlP cladding layer 340, and a p-AlGaAs current diffusing layer 350 are formed.

On the p-AlGaAs current diffusing layer 350, a p-GaAs contact layer 360 and a p-side electrode 370 are formed. An n-side electrode 380 is formed on the back side of the n-GaAs substrate 300.

In a light emitting element made of group III–V compound semiconductors (e.g., GaAs, AlGaAs, and InGaAlP) having As and P as group V elements, a sufficiently thick current diffusing layer (the AlGaAs current diffusing layer 350) is formed on a p-semiconductor layer without forming any transparent electrode on a p-semiconductor layer (the InGaAlP cladding layer 340). This sufficiently thick current diffusing layer has a function of evenly injecting an electric current into the entire InGaAlP active layer 330. Since the AlGaAs current diffusing layer 350 increases the light generation efficiency in the vicinity of the active layer, satisfactory optical power can be assured.

In the light emitting element shown in FIG. 4, an electric current given to the p-side electrode 370 is injected into the InGaAlP active layer 330 via the p-AlGaAs current diffusing layer 350. Light generated near the InGaAlP active layer 330 is emitted upward from the p-AlGaAs current diffusing layer 350 except for a region where the p-side electrode 370 exists.

The film thickness, however, of the current diffusing layer 350 must be increased to well diffuse the electric current for the reason explained below. That is, if the film thickness is small, the electric current is not diffused but injected only into the active layer 330 immediately below the p-side electrode 370. Consequently, most of the light generated near the active layer 330 is interrupted by the p-side electrode 370.

In the fabrication of an LED and an LD (Laser Diode), MO-CVD (Metal Organic-Chemical Vapor Deposition) or MBE (Molecular Beam Epitaxy) is often used as a crystal growth method. This is so because these methods can well control the film thickness in the formation of a thin film and thereby can form a high-quality film.

Unfortunately, these methods have the problem that they are inappropriate to form sufficiently thick films. That is, when MO-CVD or MBE is used, a very long time is required to form the sufficiently thick current diffusing layer 350 used in the light emitting element shown in FIG. 4. This worsens the productivity.

Additionally, in the light emitting element shown in FIG. 4, the light generated in the InGaAlP active layer 330 is absorbed by the n-GaAs substrate 300. This lowers the light extraction efficiency of the light emitting element shown in FIG. 4.

As a method of solving this problem of light absorption by the GaAs substrate 300, it is possible to form a flip chip type LED described earlier. However, the GaAs substrate 300 is opaque. Accordingly, a device from which this GaAs substrate 300 is removed is prepared, and a transparent substrate which transmits light is bonded to this device.

FIG. 5 shows a light emitting element using this technology.

On a p-GaP substrate 400, a p-InGaAlP adhesive layer 410 and a p-InGaAlP cladding layer 420 are formed. An InGaAlP active layer 430 is formed on the p-InGaAlP cladding layer 420. On this InGaAlP active layer 430, an n-InGaAlP cladding layer 440 and an n-AlGaAs window layer 450 are formed.

In addition, an electrode 460 having high reflectance and an n-side electrode 470 are formed on the AlGaAs window layer 450. A p-side electrode 480 is formed on the back side of the p-GaP substrate 400.

Note that the GaP substrate 400 has a bandgap of 2.26 eV ($\lambda \approx 548$ nm) at room temperature and is transparent to red light.

With this arrangement, of light generated in the InGaAlP active layer 430, light traveling to the p-GaP substrate 400 is directly emitted to the outside of the chip. Also, of light generated in the InGaAlP active layer 430, light heading to the electrode 460 is reflected by this electrode 460 having high reflectance. This reflected light travels to the p-GaP substrate 400 and is emitted to the outside of the chip.

In the electrode 460, however, it is difficult to achieve an ohmic contact and high reflectance at the same time by the use of a single material. Therefore, this electrode 460 is given a two-layered structure including an ohmic layer and high-reflection layer. In this case, as described previously, the interdiffusion of metals between the ohmic layer and the high-reflection layer is a problem.

FIG. 6 shows a light emitting element using the technology of bonding a GaP substrate to a device from which a GaAs substrate is removed.

In this technology, light is reflected by the bonding surface between a GaP substrate 400 and a p-side substrate 480 and extracted upward from an AlGaAs window layer 450.

Compared to the light emitting element shown in FIG. 5, this light emitting element shown in FIG. 6 is characterized by having no high-reflectance electrode on the n-AlGaAs window layer 450. In this structure, however, an alloy layer produced in the boundary between the p-GaP substrate 400 and the p-side electrode 480 scatters and absorbs light. This makes effective extraction of light to the outside of the chip difficult.

As described above, light is extracted from the conventional light emitting elements by the two methods: extraction from a light emitting layer, and extraction from a substrate.

When, however, a transparent electrode for diffusing an electric current is formed on the entire surface of a light emitting layer and light is extracted from this light emitting layer, the trade-off between the light transmittance and the conductivity is a problem. That is, if the thickness of the transparent electrode is decreased to increase the light transmittance, the conductivity lowers; if the thickness of the transparent electrode is increased to increase the conductivity, the light transmittance lowers.

In a structure in which an n-side electrode is formed on a portion of a light emitting layer and a thick current diffusing layer is formed below this n-side electrode, if light is to be extracted from the light emitting layer by reflecting it by a p-side electrode formed on the back side of a GaP substrate, this light is scattered and absorbed by the bonding surface between the GaP substrate and the p-side electrode. This worsens the light extraction efficiency.

Also, in a structure in which an n-side electrode is formed on a portion of a light emitting layer and a thick current diffusing layer is formed below this n-side electrode, if light is to be extracted from the substrate by reflecting it by the light emitting layer, the n-side electrode on the light emitting layer must have high reflectance. This high-reflectance n-side electrode can be realized by using a two-layered structure including an ohmic layer and high-reflection layer as an electrode structure. In this case, however, the interdiffusion of metals between the ohmic layer and the high-reflection layer is a problem.

BRIEF SUMMARY OF THE INVENTION

It is an object of the present invention to provide a light emitting element electrode structure capable of simultaneously achieving an ohmic contact and high reflectance and preventing interdiffusion of metals, thereby improving the performance and reliability of the light emitting element and lowering the operating voltage of the element. It is another object of the present invention to suppress scattering and absorption of light in an electrode portion of a light emitting element, thereby increasing the light emission efficiency.

A light emitting element of the present invention comprises a substrate, a light emitting element formed on the substrate to emit light, and a first electrode contacting the light emitting layer. This first electrode includes an ohmic layer in ohmic contact with the light emitting layer, a first barrier layer formed on the ohmic layer to prevent diffusion of metal atoms, and a light reflecting layer formed on the first barrier layer to reflect light.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIG. 17 is a view showing the second embodiment of the light emitting element of the present invention;

FIG. 18 is a view showing a modification of the light emitting element shown in FIG. 17;

DETAILED DESCRIPTION OF THE INVENTION

Light emitting elements and semiconductor devices using these light emitting elements according to the present invention will be described below with reference to the accompanying drawings.

Figure 1:
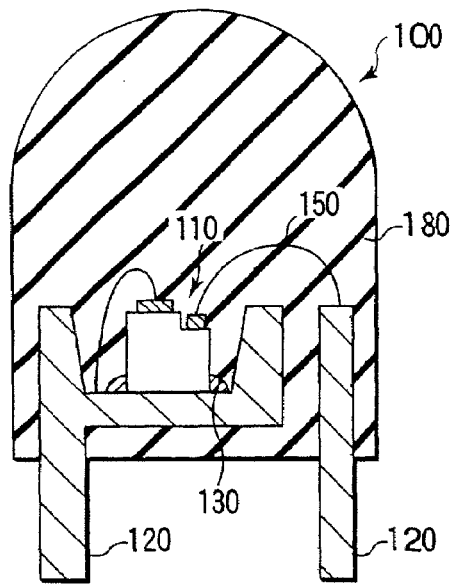
FIG. 1 is a view showing a conventional LED.
Figure 2:
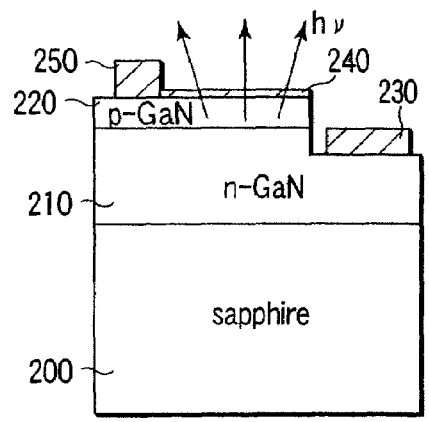
FIG. 2 is a view showing the first example of a conventional light emitting element.
Figure 3:
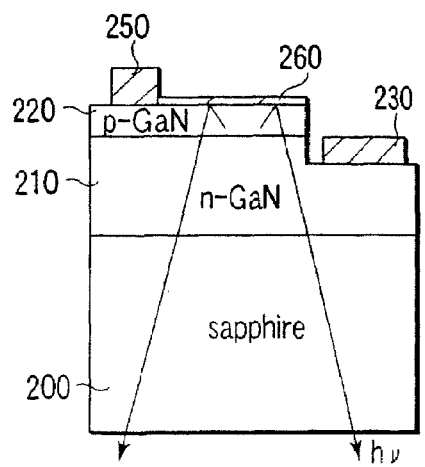
FIG. 3 is a view showing the second example of a conventional light emitting element.
Figure 4:
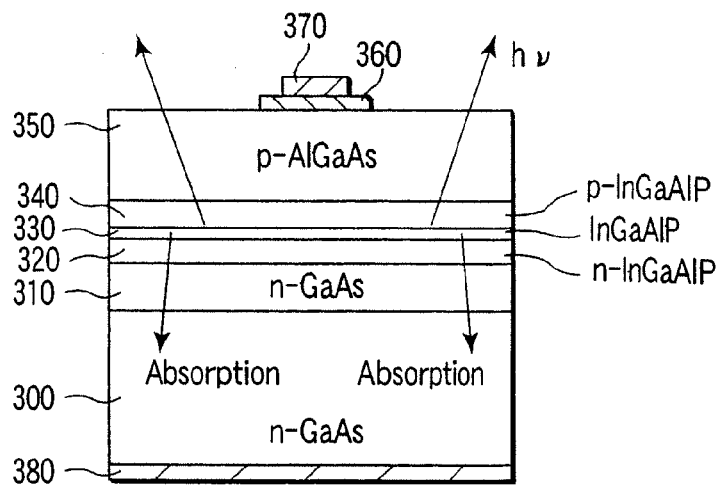
FIG. 4 is a view showing the third example of a conventional light emitting element.
Figure 5:
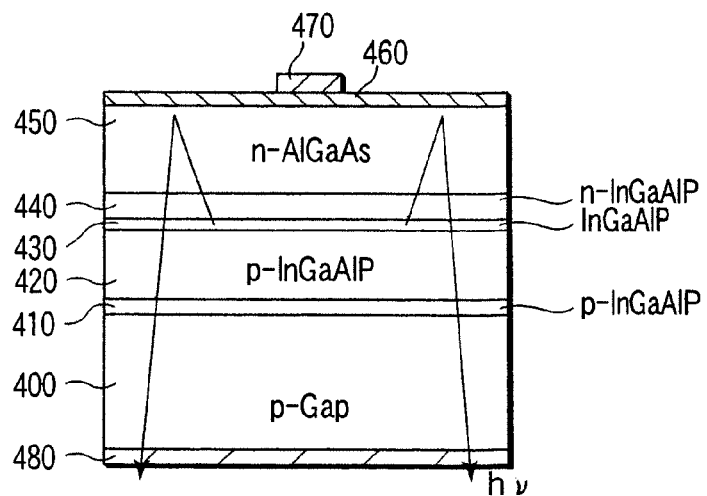
FIG. 5 is a view showing the fourth example of a conventional light emitting element.
Figure 6:
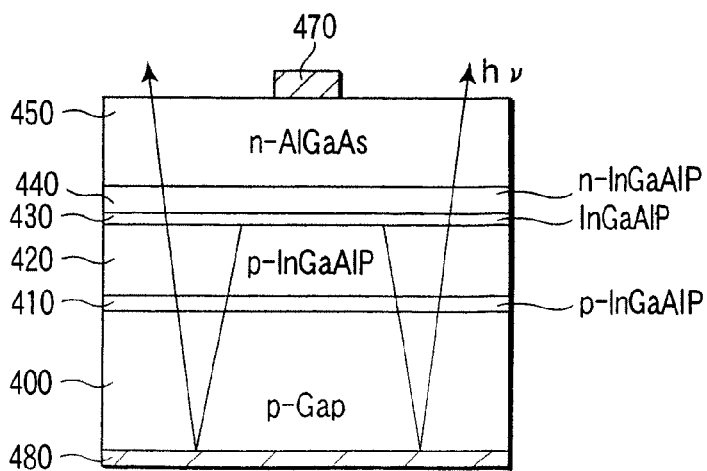
FIG. 6 is a view showing the fifth example of a conventional light emitting element.
Figure 7:
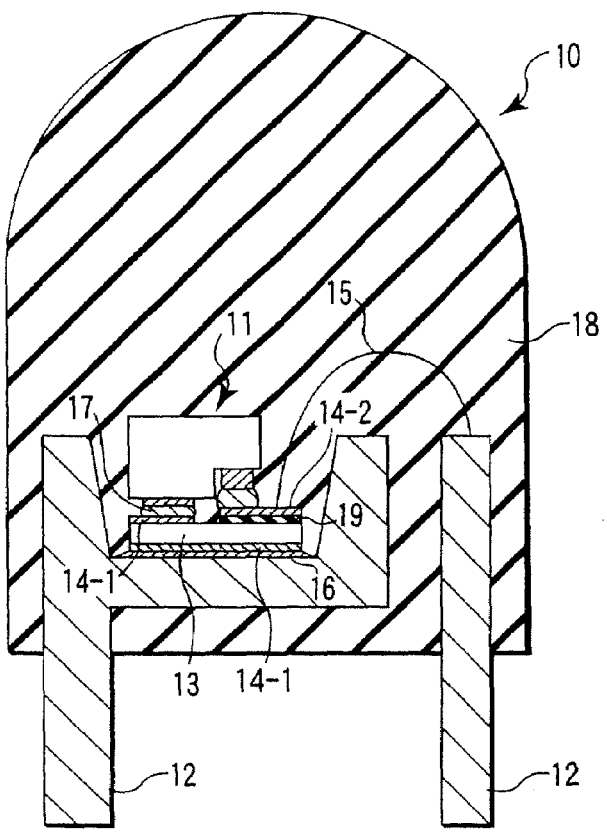
FIG. 7 is a view showing an LED of the present invention.

FIG. 7 shows a lamp type LED of the present invention.

A submount 13 is placed on a lead frame 12. This submount 13 is made of, e.g., a silicon substrate. On the upper surface of the submount 13, high-conductivity ohmic electrodes 14-1 and 14-2 having a thickness of about 100 µm are formed.

The positions of these ohmic electrodes 14-1 and 14-2 match the positions of electrodes of a light emitting element 11. The ohmic electrodes 14-1 and 14-2 are physically separated from each other, and an insulating film 19 is formed only immediately below the ohmic electrode 14-2. This ohmic electrode 14-2 is electrically connected to the lead frame 12 by a bonding wire 15. The lower surface of the submount 13 is adhered to the lead frame 12 by a conductive paste 16.

The light emitting element 11 for emitting violet light is placed on the submount 13. This light emitting element 11 has p- and n-side electrodes. The light emitting element 11 is bonded on the submount 13 by flip chip bonding by using AuSn 17. The light emitting element 11 is covered with an epoxy resin 18.

Figure 8:
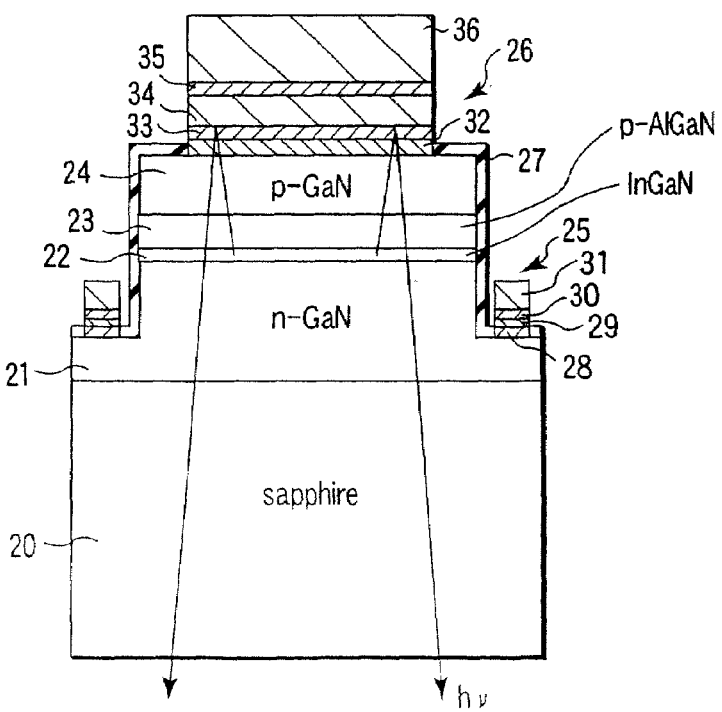
FIG. 8 is a view showing the first embodiment of a light emitting element of the present invention.

FIG. 8 shows the light emitting element shown in FIG. 7.

An n-GaN layer 21 is formed on a sapphire substrate 20. On this n-GaN layer 21, an InGaN active layer 22, a p-AlGaN cladding layer 23, and a p-GaN layer 24 are formed. In addition, the n-GaN layer 21 has a recess at the edge of the sapphire substrate 20. Since the InGaN active layer 22, the p-AlGaN cladding layer 23, and the p-GaN layer 24 do not exist on this recess, the n-GaN layer 21 is exposed in this recess.

An n-side electrode 25 is formed on the n-GaN layer 21 in the recess. A p-side electrode 26 is formed on the p-GaN layer 24. The surfaces of the n-GaN layer 21, the InGaN active layer 22, the p-AlGaN cladding layer 23, and the p-GaN layer 24 are covered with an insulating film 27, except for regions where the n-side electrode 25 and the p-side electrode 26 are formed.

The n-side electrode 25 has a four-layered structure. This four-layered structure includes a Ti layer 28, an Al layer 29, a Ti layer 30, and an Au layer 31 in this order from the n-GaN layer 21. The p-side electrode 26 has a five-layered structure. This five-layered structure includes an Ni layer 32, an Mo layer 33, an Al layer 34, a Ti layer 35, and an Au layer 36 in this order from the p-GaN layer 24.

The Ni layer 32 is an ohmic layer for achieving an ohmic contact with the p-GaN layer 24. The thickness of this Ni layer 32 is set to about 4 nm. The Mo layer 33 and the Ti layer 35 function as barrier layers for preventing diffusion of impurities. The Al layer 34 reflects light at high reflectance. The Au layer 36 functions as an overcoat electrode for improving the contact with the submount 13.

As shown in FIG. 7, the light emitting element shown in FIG. 8 is bonded by flip chip bonding on the submount 13 with the back side of the sapphire substrate 20 facing up.

In this light emitting element and the LED using the element, when a voltage is applied between the two lead frames 12 an electric current is injected into the InGaN active layer 22 from the p-side electrode 26. When this electric current is injected into the InGaN layer 22, the InGaN active layer 22 emits light. This light generated by the LED is spontaneous emission light different from induced emission light. Hence, the light generated by the InGaN layer 22 has no directivity and is radiated in every direction from the InGaN layer 22.

In the LED shown in FIG. 7 and the light emitting element shown in FIG. 8, light is extracted from the sapphire substrate 20.

That is, light traveling from the InGaN active layer 22 to the sapphire substrate 20 is output to the outside of the chip via the n-GaN layer 21 and the sapphire substrate 20 which are transparent to the wavelength of light. On the other hand, light traveling from the InGaN active layer 22 to the p-AlGaN cladding layer 23 is reflected by the Al layer 34 having high reflectance to the wavelength of light. This reflected light is output to the outside of the chip via the n-GaN layer 21 and the sapphire substrate 20.

In the latter case, the light generated in the InGaN layer 22 makes a round trip along the path passing through the Ni layer 32 and the Mo layer 33. Note that the Ni layer 32 and the Mo layer 33 are sufficiently thinned to have a low light scattering coefficient and a low light absorption coefficient.

A method of manufacturing the LED shown in FIG. 7 and the light emitting element shown in FIG. 8 will be described below.

Figure 9:
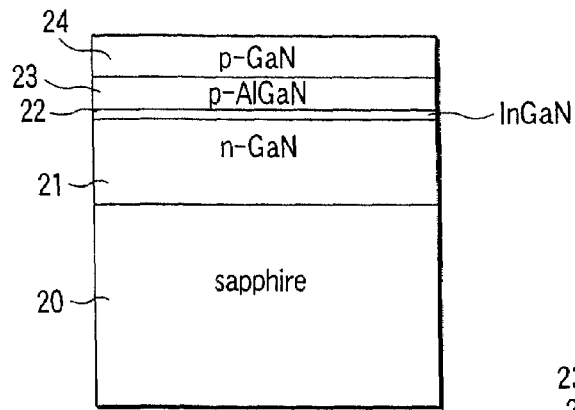
FIG. 9 is a view showing one step of a manufacturing method of the present invention.

First, as shown in FIG. 9, MO-CVD is used to form an undoped GaN buffer layer on a sapphire substrate 20 and form an n-GaN layer 21 on this buffer layer. Subsequently, an InGaN active layer 22 is formed on the n-GaN layer 21 by MO-CVD or MBE. This InGaN active layer 22 can have an SQW (Single Quantum Well) structure or an MQW (Multiple Quantum Well) structure. In addition, a p-AlGaN cladding layer 23 and a p-GaN layer 24 are formed on the InGaN active layer 22 by MO-CVD.

Figure 10:
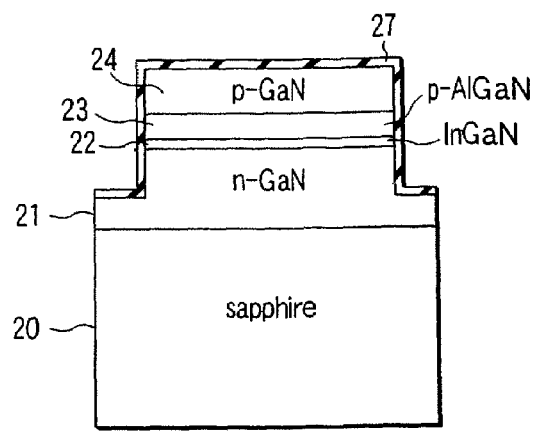
FIG. 10 is a view showing one step of the manufacturing method of the present invention.

As shown in FIG. 10, lithography and anisotropic etching such as RIE (Reactive Ion Etching) are used to remove portions of the p-GaN layer 24, the p-AlGaN cladding layer 23, the InGaN active layer 22, and the n-GaN layer 21, thereby forming a recess in the edge of the sapphire substrate 20. After that, an insulating film 27 is formed on the surfaces of the p-GaN layer 24, the p-AlGaN cladding layer 23, the InGaN active layer 22, and the n-GaN layer 21 by CVD.

This recess can also be formed by isotropic etching such as wet etching, rather than by anisotropic etching such as RIE.

Figure 11:
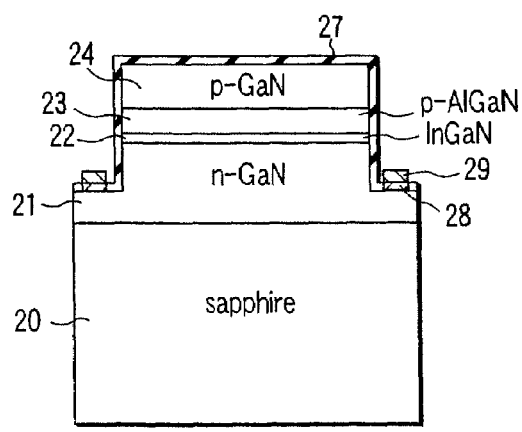
FIG. 11 is a view showing one step of the manufacturing method of the present invention.

As shown in FIG. 11, lithography and wet etching are used to remove a portion of the insulating film 27 on the n-GaN layer 21. After that, a Ti layer 28 and an Al layer 29 are formed by vacuum evaporation and lift-off. Also, the structure is annealed in a nitrogen atmosphere at about 600° C. to form an ohmic contact between the n-GaN layer 21 and the Ti layer 28.

Figure 12:
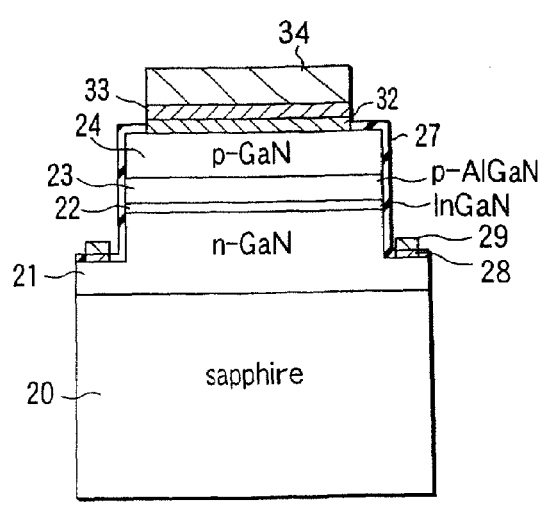
FIG. 12 is a view showing one step of the manufacturing method of the present invention.

As shown in FIG. 12, lithography and wet etching are used to remove a portion of the insulating film 27 on the p-GaN layer 24. After that, an Ni layer 32 about 4 nm thick, an Mo layer 33 about 1 nm thick, and an Al layer 34 about 500 nm thick are formed by vacuum evaporation and lift-off.

If flash annealing is performed at a temperature of 400° C. to 780° C. (preferably 450° C.) for 20 sec immediately after the Ni layer 32 is formed, an ohmic contact between the p-GaN layer 24 and the Ni layer 32 can be easily formed.

It is, however, not particularly necessary to perform this flash annealing if no natural oxide film exists in a portion between the Ni layer 32 and the p-GaN layer 24 and if this portion is satisfactorily clean.

Subsequently, as shown in FIG. 8, vacuum evaporation and lift-off are used to form Ti layers 30 and 35 about 100 nm thick and Au layers 31 and 36 about 1,000 nm thick on the Al layers 29 and 34, respectively. To improve adhesion between a plurality of layers forming electrodes 25 and 26, flash annealing is performed at a temperature of about 200° C. or more (favorably about 250° C.) for 20 sec.

The temperature of this flash annealing is set to be lower than that of flash annealing performed in the step shown in FIG. 12, if flash annealing is performed in the step shown in FIG. 12.

A semiconductor element of the present invention is completed by the above method.

The semiconductor element manufactured by the above method is packaged to form an LED (semiconductor device) of the present invention.

That is, as shown in FIG. 7, the light emitting element 11 is mounted on the submount 13 having the ohmic electrodes 14-1 and 14-2 made of an Au layer about 3 µm thick by flip chip bonding. Consequently, the n-side electrode 25 is connected to the electrode 14-1 by the bump (e.g., AuSn, PbSn, AgSn) 17, and the p-side electrode 26 is connected to the electrode 14-2 by the bump 17.

The submount 13 on which the light emitting element 11 is mounted is adhered to the cup type lead frame 12 by using the conductive paste 16. In this state, the electrode 14-1 is electrically connected to the cup type lead frame 12. Also, the electrode 14-2 and the lead frame 12 are electrically connected by wire bonding. Furthermore, the light emitting element 11 is covered with the epoxy resin 18.

If the light emitting element 11 is formed using an n-GaN substrate as a conductive substrate, rather than a sapphire substrate, the n-side electrode can also be formed on the back side of this n-GaN substrate.

The LED of the present invention is completed by the above method.

In the light emitting element, the LED, and the methods of fabricating them, the p-side electrode 26 has the Ni layer 32 for forming an ohmic contact with the p-GaN layer 24, the Mo layer 33 having a barrier function of blocking impurity diffusion, and the Al layer 34 having high reflectance to light generated in the element.

Generally, an ohmic contact to a GaN layer is difficult to form when metals such as Al and Ag having high reflectance to visible light are used. Therefore, the p-side electrode is conventionally composed of an ohmic layer for forming an ohmic contact and a high-reflection layer for reflecting light generated in the element.

When an LED having this electrode structure is continuously operated, however, interdiffusion of metal atoms occurs between the ohmic layer and the high-reflection layer owing to the influence of heat. This raises the forward voltage of the light emitting diode and readily deteriorates the element. And the electrode sometimes comes off.

By contrast, in the present invention the barrier layer (e.g., Mo layer) 33 made of a high-melting metal is formed between the Ni layer 32 as an ohmic layer and the Al layer 34 as a high-reflection layer. This barrier layer prevents interdiffusion of metal atoms between the ohmic layer and the high-reflection layer. Accordingly, the present invention can prevent a rise of the operating voltage of the LED.

The ohmic layer (Ni layer 32) and the barrier layer (Mo layer 33) are made of materials substantially opaque to light generated in the element. By decreasing the thicknesses of these layers, the light reflectance of the high-reflection layer (Al layer 34) can be increased.

Figure 13:
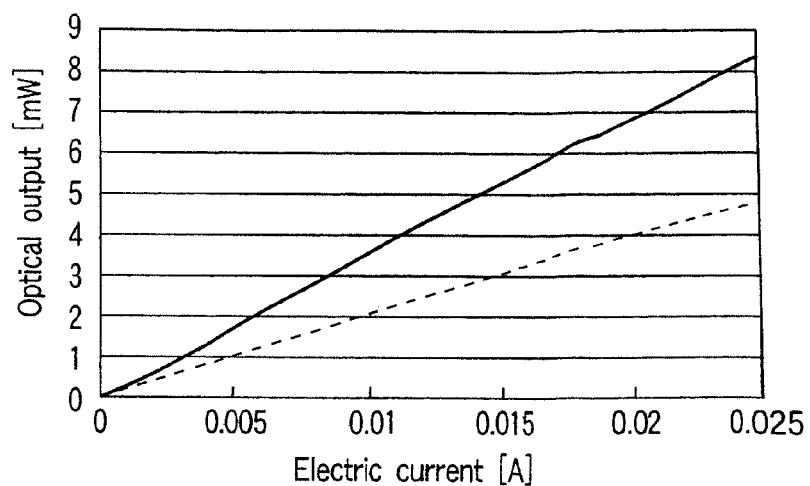
FIG. 13 is a graph showing the relationship between the electric current and optical output of the light emitting element shown in FIG. 8.

FIG. 13 shows the emission characteristic of the GaN violet type LED of the present invention.

This emission characteristic is represented by the relationship between the electric current injected into the LED and its optical output (emission intensity). Referring to FIG. 13, the solid line indicates the emission characteristic of the GaN violet type LED according to the present invention, and the broken line indicates that of a conventional LED.

As shown in FIG. 13, when the same electric current is injected into these LEDs, the optical output of the LED according to the present invention is about 1.7 times that of the conventional LED. For example, when the electric current injected into the LEDs is 20 mA (voltage 4.3 V), the optical output of the conventional LED is about 4.0 mW, whereas the optical output of the LED of the present invention is about 6.9 mw (emission wavelength λp=450 nm).

Also, after the LED of the present invention was operated for 1,000 hr at room temperature by using a driving current of 20 mA, the optical output reduced to about 80% of the initial value. This is a very good result compared to the conventional LED and indicates that the reliability of the LED of the present invention improved.

Figure 14:
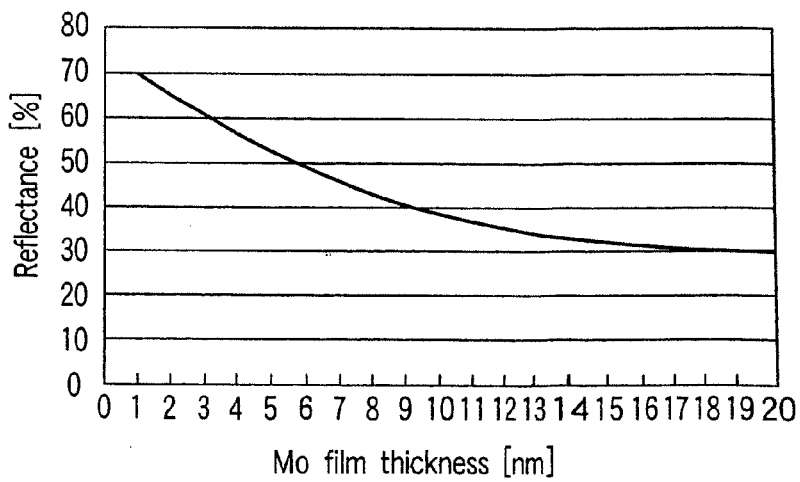
FIG. 14 is a graph showing the relationship between the thickness and reflectance of a reflecting layer of the light emitting element shown in FIG. 8.

FIG. 14 shows the relationship between the thickness of the Mo layer as a barrier layer and the light reflectance of the Al layer as a high-reflection layer.

In this relationship, the thickness of the Ni layer as an ohmic layer is fixed to 4 nm, and the thickness of the Al layer as a high-reflection layer is fixed to 100 nm.

Figure 15:
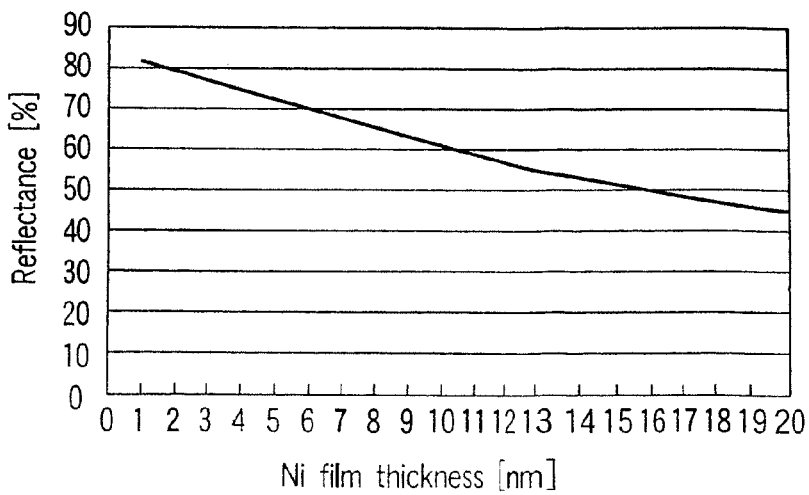
FIG. 15 is a graph showing the relationship between the thickness of reflectance of an ohmic layer of the light emitting element shown in FIG. 8.

FIG. 15 shows the relationship between the thickness of the Ni layer as an ohmic layer and the Al layer as a high-reflection layer.

In this relationship, the thickness of the Mo layer as a barrier electrode is fixed to 1 nm, and the thickness of the Al layer as a high-reflection layer is fixed to 100 nm.

As shown in FIGS. 14 and 15, the light reflectance of the Al layer largely depends upon the thicknesses of the barrier layer and the ohmic layer; the smaller the thicknesses of these layers, the higher the light transmittance. In particular, the thickness of the ohmic layer into which light generated in the InGaN active layer initially enters is preferably as small as possible. For example, when this ohmic layer is made of Ni, its thickness is set to 10 nm or less.

The ohmic layer can be formed using materials such as Pt, Mg, Zn, Be, Ag, Au, and Ge and compounds consisting primarily of these materials, in addition to Ni. Also, the barrier layer can be formed using materials such as W, Pt, Ni, Ti, Pd and V and compounds consisting primarily of these materials, in addition to Mo.

These ohmic layer and barrier layer can be integrated into a single layer if they are formed using the same material (Ni or Pt).

In the light emitting element of the present invention, the Ti layer 35 as a barrier layer and the Au layer 36 as an overcoat layer are formed on the Al layer 34 as a high-reflection layer. Commonly, a conductor pattern of Au is written on a submount on which a light emitting element is to be mounted. A light emitting element is adhered onto this conductor pattern.

If, however, a high-reflection layer made of Al or Ag is brought into direct contact with the Au conductor pattern, a high-resistance layer may be formed on the bonding surface between them, or the bonding power between them weakens.

In the present invention, therefore, an overcoat layer made of the same material as the conductor pattern (e.g., Au) on the submount is formed, thereby preventing the generation of a high-resistance layer and increasing the bonding power between the light emitting element and the submount.

In addition, in the present invention the barrier layer (Ti layer 35) made of a high-melting metal is formed between the overcoat layer and the high-reflection layer. Since this barrier layer prevents diffusion of metal atoms from the overcoat layer to the high-reflection layer, the bonding power between the overcoat layer and the conductor pattern can be increased.

When the conductor pattern and the high-reflection layer are made of the same material, it is of course unnecessary to form a high-melting-material barrier layer between the overcoat layer and the high-reflection layer.

This barrier layer interposed between the overcoat layer and the high-reflection layer can be formed using materials such as W, Mo, Pt, Ni, Ti, Pd, and V and compounds consisting primarily of these materials, in addition to Ti.

Furthermore, in the present invention the light emitting element is not in direct contact with the lead frame but is mounted on the lead frame via the submount. In this structure, heat generated in the light emitting element is efficiently radiated via the submount. This can increase the heat radiation efficiency and improve the reliability of the LED.

Figure 16:
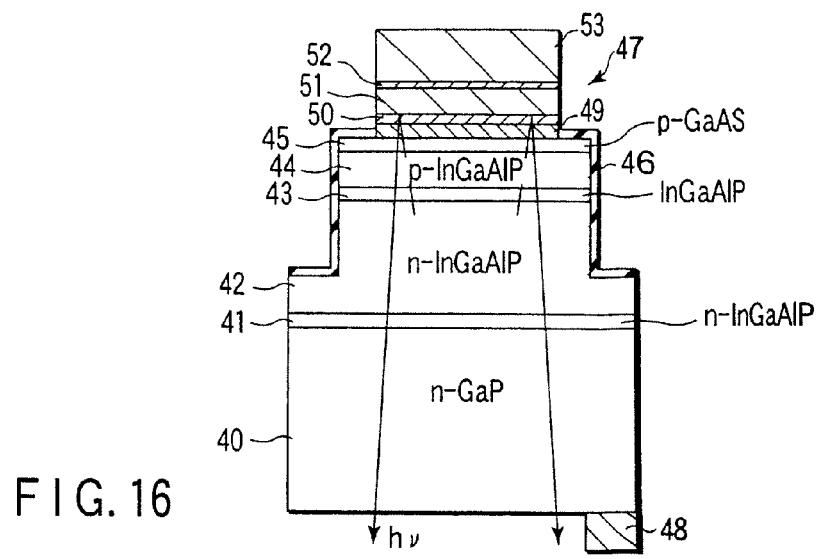
FIG. 16 is a view showing a modification of the light emitting element shown in FIG. 8.

FIG. 16 shows a modification of the light emitting element shown in FIG. 8.

On an n-GaP substrate 40, an n-InGaAlP adhesive layer 41 and an n-InGaAlP cladding layer 42 are formed. On this n-InGaAlP cladding layer 42, an InGaAlP active layer 43 is formed. As InGaAlP, a direct transition type band structure is used to obtain red light to green light, unlike AlGaAs for which an indirect transition type band structure is used to obtain green light.

On the InGaAlP active layer 43, a p-InGaAlP cladding layer 44 and a p-GaAs contact layer 45 are formed. A p-side electrode 47 is formed on the p-GaAs contact layer 45, and an n-side electrode 48 is formed on the back side of the n-GaP substrate 40. The surfaces of the n-InGaAlP cladding layer 42, the InGaAlP active layer 43, the p-InGaAlP cladding layer 44, and the p-GaAs contact layer 45 are covered with an insulating film 46, except for a region where the p-side electrode 47 is formed.

The p-side electrode 47 includes an AuZn layer 49, an Mo layer 50, an Al layer 51, a Ti layer 52, and an Au layer 53. The Auzn layer 49 forms an ohmic contact with the p-GaAs contact layer 45. The Mo layer 50 is a barrier layer having a function of preventing interdiffusion of metal atoms. The Al layer 51 is a high-reflection layer having a function of reflecting light generated in the element at high reflectance. The Ti layer 52 is a barrier layer having a function of preventing interdiffusion of metal atoms. The Au layer 53 is an overcoat layer for improving the contact with a submount.

As shown in FIG. 7, this light emitting element shown in FIG. 16 is mounted on a submount 13 by flip chip bonding, with the back side of the n-GaP substrate 40 facing up.

In this modification, the n-side electrode 48 is formed on the back side of the n-GaP substrate 40. That is, this n-side electrode 48 is formed on the surface different from the surface on which the p-side electrode 47 is formed. Hence, the n-side electrode and the lead frame are electrically connected directly by a bonding wire. However, the n-side electrode 48 and the p-side electrode 47 can also be formed on the same surface.

In this light emitting element as described above, the barrier layer (e.g., an Mo layer) made of a high-melting metal is formed between the ohmic layer (e.g., an AuZn layer) and the high-reflection layer (e.g., an Al layer). Since this barrier layer prevents interdiffusion of metal atoms between the ohmic layer and the high-reflection layer, a rise of the operating voltage of the LED can be prevented. Consequently, effects similar to those of the light emitting element shown in FIG. 8 can be obtained.

A method of fabricating the p-side electrode 47 of the light emitting element according to the present invention is the same as the method of fabricating the p-side electrode of the light emitting element shown in FIG. 8, so a detailed description thereof will be omitted.

FIG. 17 shows the second embodiment of the light emitting element of the present invention.

This light emitting element relates to a GaN violet type LED.

Compared to the light emitting element (FIG. 8) explained in the above first embodiment, the characteristic feature of the light emitting element according to this embodiment is the structure of a p-side electrode 26.

An Ni layer 32 as an ohmic layer in contact with a p-GaN layer 24 is made up of a plurality of dots (islands) arranged into arrays. An Mo layer 33 as a barrier layer is formed on the Ni layer 32 and the p-GaN layer 24. Accordingly, the p-GaN layer 24 is in contact with both the Ni layer 32 and the Mo layer 32.

Of light generated in an InGaN active layer 22, a portion of light heading to a p-AlGaN cladding layer 23 passes through the Ni layer 32 and the Mo layer 33 with low scattering and low absorption. Another portion of the light heading to the p-AlGaN cladding layer 23 passes only through the Mo layer 33 without passing through the Ni layer 32.

In this light emitting element as described above, the ohmic layer (Ni layer) for forming an ohmic contact with the p-GaN layer does not cover the entire surface of the p-side electrode; this ohmic layer partially covers the p-side electrode as, e.g., a plurality of dots (islands) arranged into arrays. Therefore, in a region where this ohmic layer exists, an ohmic contact is formed between the p-side electrode and the p-GaN layer. In a region where the ohmic layer does not exist, only the barrier layer is formed between the p-GaN layer and the Al layer as a high-reflection layer, thereby shortening the distance between the two layers.

In a region where the ohmic layer is absent, therefore, the light transmittance can be increased accordingly. As a consequence, the light extraction efficiency can be increased.

The ohmic layer can be formed using materials such as Ni, Pt, Mg, Zn, Be, Ag, Au, and Ge and compounds consisting primarily of these materials. The barrier layer can be formed using materials such as Mo, W, Pt, Ni, Ti, Pd and V and compounds consisting primarily of these materials.

The ohmic layer and the barrier layer can also be formed using the same material (e.g., Ni or Pt).

FIG. 18 shows a modification of the light emitting element shown in FIG. 17.

On an n-GaP substrate 40, an n-InGaAlP adhesive layer 41 and an n-InGaAlP cladding layer 42 are formed. On this n-InGaAlP cladding layer 42, an InGaAlP active layer 43 is formed.

On the InGaAlP active layer 43, a p-InGaAlP cladding layer 44 and a p-GaAs contact layer 45 are formed. A p-side electrode 47 is formed on the p-GaAs contact layer 45, and an n-side electrode 48 is formed on the back side of the n-GaP substrate 40. The surfaces of the n-InGaAlP cladding layer 42, the InGaAlP active layer 43, the p-InGaAlP cladding layer 44, and the p-GaAs contact layer 45 are covered with an insulating film 46, except for a region where the p-side electrode 47 is formed.

The p-side electrode 47 includes an AuZn layer 49, an Mo layer 50, an Al layer 51, a Ti layer 52, and an Au layer 53. The Auzn layer 49 forms an ohmic contact with the p-GaAs contact layer 45. The Mo layer 50 is a barrier layer having a function of preventing interdiffusion of metal atoms. The Al layer 51 is a high-reflection layer having a function of reflecting light generated in the element at high reflectance. The Ti layer 52 is a barrier layer having a function of preventing interdiffusion of metal atoms. The Au layer 53 is an overcoat layer for improving the contact with a submount.

The AuZn layer 49 as an ohmic layer is made up of a plurality of dots (islands).

As shown in FIG. 7, this light emitting element shown in FIG. 18 is mounted on a submount 13 by flip chip bonding, with the back side of the n-GaP substrate 40 facing up.

In this modification, the n-side electrode 48 is formed on the back side of the n-GaP substrate 40. That is, this n-side electrode 48 is formed on the surface different from the surface on which the p-side electrode 47 is formed. Hence, the n-side electrode and the lead frame are electrically connected directly by a bonding wire. However, the n-side electrode 48 and the p-side electrode 47 can also be formed on the same surface.

In this light emitting element as described above, the barrier layer (e.g., an Mo layer) made of a high-melting metal is formed between the ohmic layer (e.g., an AuZn layer) and the high-reflection layer (e.g., an Al layer). Since this barrier layer prevents interdiffusion of metal atoms between the ohmic layer and the high-reflection layer, a rise of the operating voltage of the LED can be prevented. Consequently, effects similar to those of the light emitting element shown in FIG. 8 can be obtained.

Figure 19:
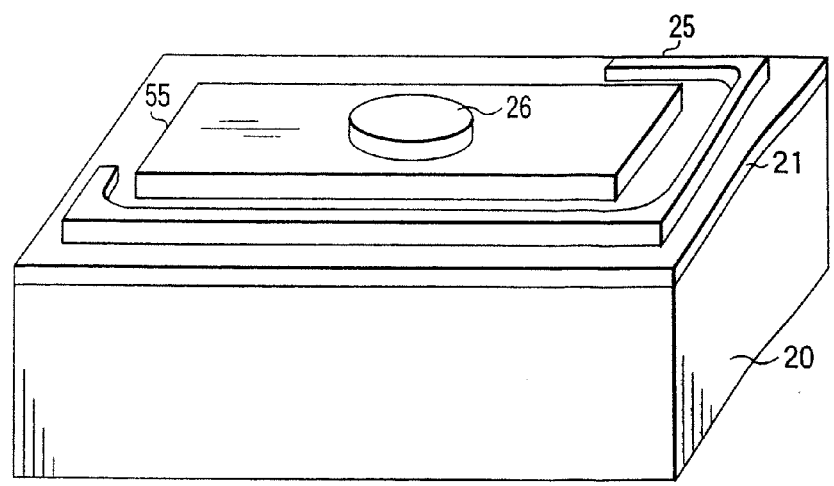
FIG. 19 is a view showing the third embodiment of the light emitting element of the present invention.

FIG. 19 shows the third embodiment of the light emitting element of the present invention.

On a sapphire substrate 20, an n-GaN layer 21 and a light emitting layer 55 are formed. For example, this light emitting layer 55 includes, as shown in FIG. 8, an InGaN active layer 22 on the n-GaN layer 21, a p-AlGaN cladding layer 23 on the InGaN active layer 22, and a p-GaN layer 24 on the p-AlGaN cladding layer 23.

A p-side electrode 26 is formed on the light emitting layer 55. For example, this p-side electrode 26 includes, as shown in FIG. 8, an ohmic layer 32, a barrier layer 33, a high-reflection layer 34, a barrier layer 35, and an overcoat layer 36.

The p-side electrode 26 is placed in a central portion on the upper surface of the light emitting layer 55. Also, an n-side electrode 25 is placed at the edge on the upper surface of the n-GaN layer 21 to surround the light emitting layer 55.

The LED shown in FIG. 7 is completed by mounting the above light emitting element on a lead frame by using a submount and covering the light emitting element with an epoxy resin.

This light emitting element can achieve the following effects in addition to the effects of the light emitting elements of the aforementioned first and second embodiments.

First, since the p-side electrode is positioned in the central portion of the chip, the light emitting element is readily aligned when mounted on the submount. This can facilitate the fabrication of the LED and thereby improve the throughput.

Second, since the n-side electrode surrounds the light emitting layer, an electric current flowing from the p-side to the n-side electrode is evenly injected into the active layer. Hence, the light emitting layer can generate light with high efficiency.

Figure 20:
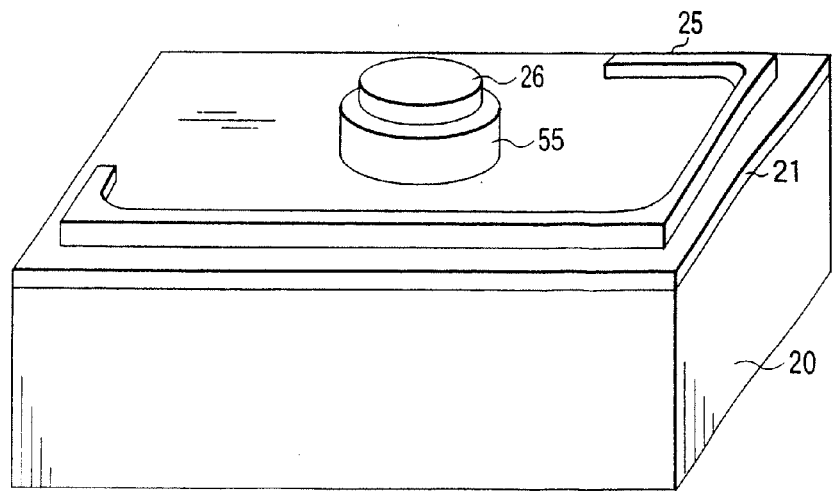
FIG. 20 is a view showing a modification of the light emitting element shown in FIG. 19.

FIG. 20 shows a modification of the light emitting element shown in FIG. 19.

The characteristic feature of the light emitting element of this embodiment is that the shape of a light emitting layer 55 is different from that of the light emitting element shown in FIG. 19.

In the light emitting element shown in FIG. 19, the light emitting layer 55 is formed in a wide region including a region immediately below the p-side electrode 26, and the shape of this light emitting layer 55 is a square similar to that of the chip. By contrast, in the light emitting element shown in FIG. 20, the light emitting layer 55 is formed only in a region immediately below the p-side electrode 26 and a narrow region surrounding that region, and the shape of this light emitting layer 55 is a circle similar to that of the p-side electrode.

In the light emitting element of this embodiment, the light emitting region is limited. Therefore, the light emitting element of this embodiment can be used as a signal source of an optical fiber system or in a system required to operate at high speed.

In the light emitting elements shown in FIGS. 19 and 20, the shapes of the n-side electrode 25, the p-side electrode 26, and the light emitting element 55 can be variously changed.

For example, the p-side electrode 26 can be a square, or the n-side electrode 25, the p-side electrode 26, and the light emitting layer 55 can take shapes other than a circle and square.

The light emitting element according to the third embodiment described above is applicable to, e.g., a GaN light emitting element, GaAs light emitting element, and GaP light emitting element. This light emitting element is also applicable to an LED which uses a conductive substrate instead of a sapphire substrate.

Figure 21:
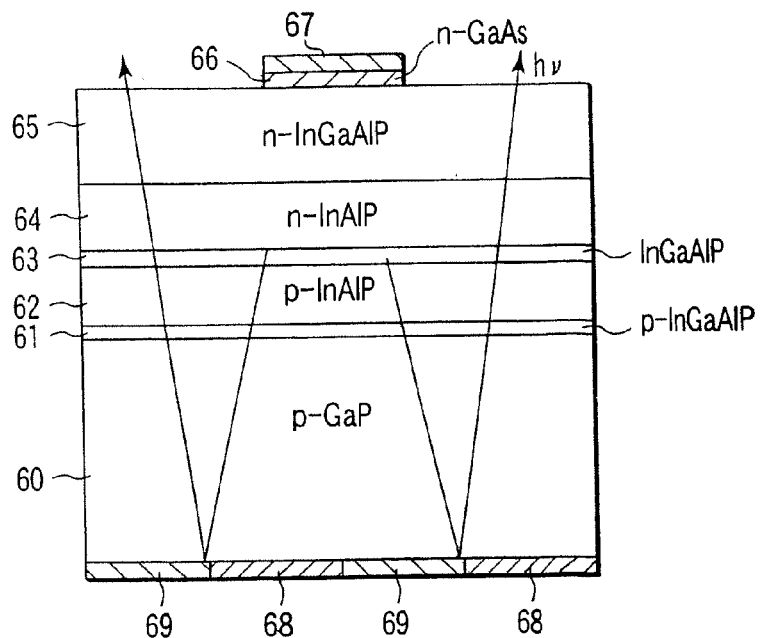
FIG. 21 is a view showing the fourth embodiment of the light emitting element of the present invention.

FIG. 21 shows the fourth embodiment of the light emitting element of the present invention.

The light emitting element of this embodiment is applied to a GaAs light emitting element and GaP light emitting element, and generates red light having a wavelength of, e.g., 620 nm.

On a p-GaP substrate 60, a p-InGaAlP adhesive layer 61 and a p-InAlP cladding layer 62 are formed. An InGaAlP active layer 63 is formed on the p-InAlP cladding layer 62. An n-type InAlP cladding layer 64 is formed on the InGaAlP active layer 63, and an n-InGaAlP window layer 65 is formed on this n-type InAlP cladding layer 64. Also, an n-GaAs contact layer 66 is formed on the n-InGaAlP window layer 65, and an n-side electrode 67 is formed on the n-GaAs contact layer 66. In addition, a p-side electrode 68 and a light reflecting film 69 are formed on the back side of the p-GaP substrate 60.

A method of manufacturing the light emitting element shown in FIG. 21 will be described below.

Figure 22:
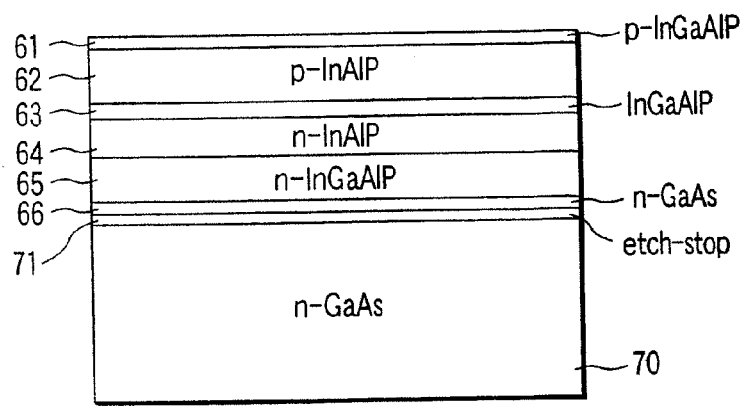
FIG. 22 is a view showing one step of a manufacturing method of the present invention.

First, as shown in FIG. 22, MO-CVD is used to form an etching stopper (e.g., InGaP) 71, an n-GaAs contact layer 66 about 0.1 μm thick, an n-$In_{0.5}Ga_{0.15}Al_{0.35}P$ window layer 65 about 0.5 μm thick, and an n-$In_{0.5}Al_{0.5}P$ cladding layer 64 about 1 μm thick in this order on an n-GaAs substrate 70.

Subsequently, MO-CVD or MBE is used to form an undoped $In_{0.5}Ga_{0.1}Al_{0.4}P$ active layer 63 about 0.2 μm thick on the n-InAlP cladding layer 64, and form a p-$In_{0.5}Al_{0.5}P$ cladding layer 62 about 1 μm thick and a p-$In_{0.5}Ga_{0.15}Al_{0.35}P$ adhesive layer 61 about 0.05 μm thick on the undoped InGaAlP active layer 63.

Examples of the gallium material are triethylgallium (TEG: $Ga(C_2H_5)_3$) and trimethylgallium (TMG: $Ga(CH_3)_3$). Examples of the aluminum material are triethylaluminum (TEA: $Al(C_2H_5)_3$) and trimethylaluminum (TMA: $[Al(CH_3)_3]_2$). Examples of the indium material are triethylindium (TEI: $In(C_2H_5)_3$) and trimethylindium (TMI: $In(CH_3)_3$). An example of the phosphorous material is tertiary-butylphosphine (TBP: $C_4H_9PH_2$).

As an n-impurity, Si, Te, or the like is used. As a p-impurity, Zn, Be, or the like is used.

Figure 23:
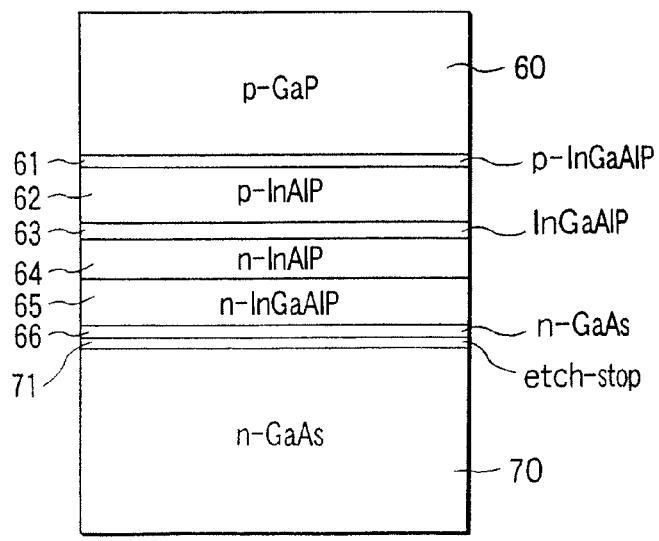
FIG. 23 is a view showing one step of the manufacturing method of the present invention.

Subsequently, as shown in FIG. 23, a p-GaP substrate 60 about 200 μm thick is adhered onto the p-InGaAlP adhesive layer 61 by thermal contact bonding. Before this adhesion, the adhesion surfaces of the p-InGaAlP adhesive layer 61 and the p-GaP substrate 60 are well cleaned.

Also, the n-GaAs substrate 70 is removed by etching.

Figure 24:
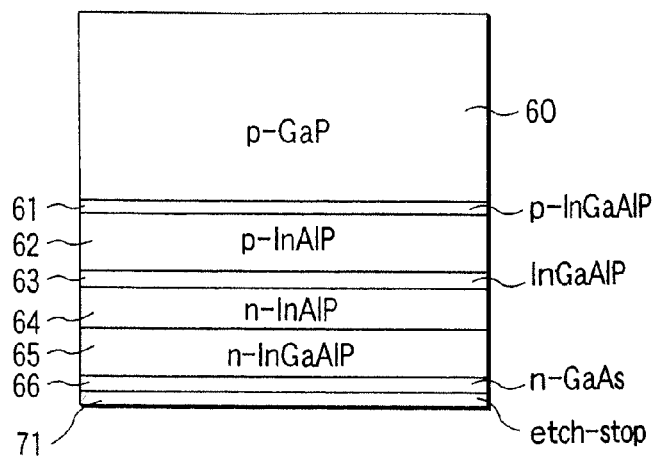
FIG. 24 is a view showing one step of the manufacturing method of the present invention.

As shown in FIG. 24, the etching stopper 71 is removed.

Figure 25:
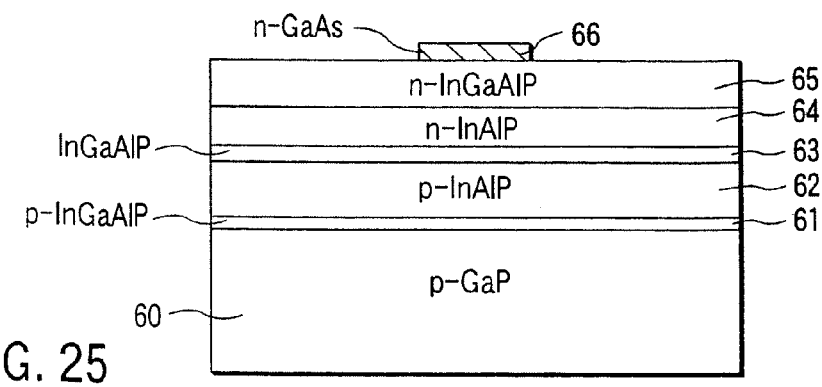
FIG. 25 is a view showing one step of the manufacturing method of the present invention.

As shown in FIG. 25, the n-GaAs contact layer 66 is patterned by photolithography and etching.

After that, an n-side electrode 67 is formed on the n-GaAs contact layer 66, and a p-side electrode 68 and a light reflecting layer (e.g., Au) 69 are formed on the back side of the p-GaP substrate 70. In this manner, the light emitting element shown in FIG. 21 is obtained.

The lamp type LED is completed by mounting the light emitting element shown in FIG. 21 on a lead frame and covering this light emitting element with an epoxy resin.

This LED emits red light when an electric current flowing from the p-side to the n-side electrode is injected into the InGaAlP active layer 63.

Of the red light having a wavelength of 620 nm generated in the InGaAlP active layer 63, light heading to the n-InAlP cladding layer 64 and the n-InGaAlP window layer 65 is directly emitted to the outside of the chip. Of the red light having a wavelength of 620 nm generated in the InGaAlP active layer 63, light heading to the p-GaP substrate 60 is transmitted through the transparent p-GaN substrate 60 and reaches the p-side electrode 68 and the light reflecting layer 69. This light is reflected by the light reflecting layer 69. The reflected light reaches the n-InAlP cladding layer 64 and the n-InGaAlP window layer 65 and is emitted to the outside of the chip.

When the light emitting element of this embodiment was mounted in a package having an emission angle of 10° and operated by a driving current of 20 mA, the optical output rose to 1.2 times (17 cd) that of a conventional light emitting element.

This light emitting element is applied to a GaAs or GaP light emitting element having a flip chip structure. Also, the light emitting element of this embodiment can reduce the loss produced in the alloy layer between the transparent substrate and the electrode, because the light reflecting layer is formed in a portion of the back side of the transparent substrate. As a consequence, in a region where the light reflecting layer is present, light can be efficiently reflected and emitted to the outside of the chip.

The material of this light reflecting layer is, e.g., Au. This is so because Au has high reflectance to light having a wavelength of 620 nm, which is generated in the InGaAlP active layer.

Table 1 shows the values of reflectance R and thermal conductivity k of metal materials.

Assume that these metal materials are in contact with the GaP substrate, and that the reflectance is a numerical value with respect to light having a wavelength of 620 nm. Refractive index n of GaP at this wavelength is 3.325. Assume also that the thermal conductivity is a numerical value at a temperature of 300K.

TABLE 1

| METAL MATERIAL | REFLECTANCE R [%] | THERMAL CONDUCTIVITY k [W/m · K] |
|---|---|---|
| Al | 77.6 | 237 |
| Cr | 29.1 | 90.3 |
| Co | 37.4 | 99.2 |
| Cu | 87.7 | 398 |
| Au | 92.1 | 315 |
| Hf | 13 | 23 |
| Mo | 20.4 | 138 |
| Ni | 37.5 | 90.5 |
| Nb | 18 | 53.7 |
| Os | 5.3 | 87.3 |
| Ag | 88.2 | 427 |
| Ta | 20.3 | 57.5 |
| Ti | 25.8 | 21.9 |
| W | 15 | 178 |

The characteristics required for a light reflecting layer are high reflectance and high thermal conductivity. In a light emitting element using InGaAlP, a lowering of the emission efficiency by heat is significant. Therefore, efficiently radiating heat generated near the active layer to the outside of the element is important. For this purpose, as is apparent from Table 1, a material having high reflectance and high thermal conductivity, e.g., Au, Ag, Cu, or Al, is used as a light reflecting layer of a light emitting element.

Referring to FIG. 21, the area of the p-side electrode 68 and the area of the light reflecting layer 69 have the following relationship. That is, when the area of the p-side electrode 68 is made larger than that of the light reflecting layer 69, the contact resistance decreases, but the light reflection efficiency lowers; when the area of the light reflecting layer 69 is made larger than that of the p-side electrode 68, the light reflection efficiency rises, but the contact resistance increases.

In the light emitting element of this embodiment, the area ratio of the p-side electrode 68 to the light reflecting layer 69 is set at, e.g., 1:1. However, this ratio can be appropriately changed in accordance with the specification of a light emitting element. For example, in a light emitting element in which a rise of the contact resistance is of no problem, the area of the light reflecting layer 69 is made larger than that of the p-side electrode 68 to raise the light reflection efficiency.

Figure 26:
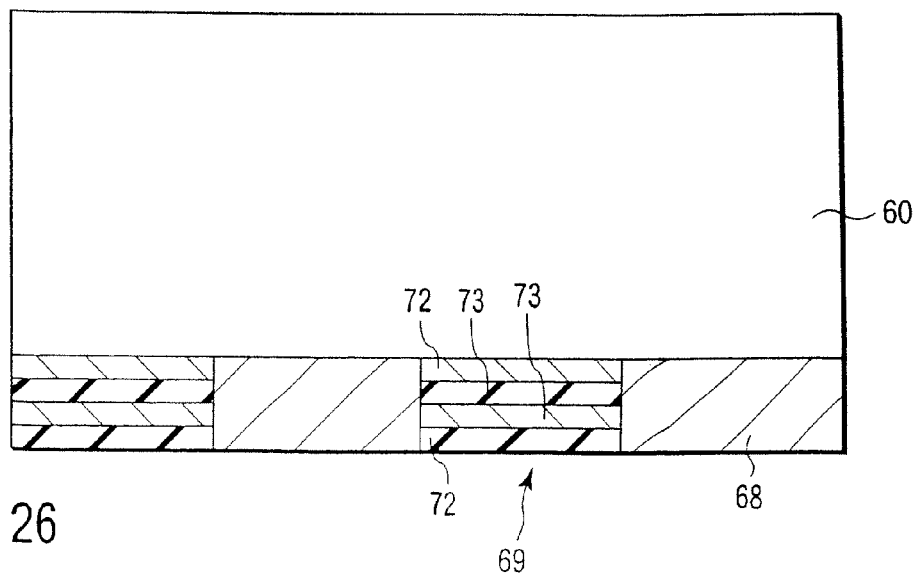
FIG. 26 is a view showing a modification of the light emitting element shown in FIG. 21.

FIG. 26 shows a modification of the light emitting element shown in FIG. 21.

The light emitting element of this modification is characterized in that the structure of a light reflecting layer is different from that of the light emitting element shown in FIG. 21.

A light reflecting layer 69 on the back side of a p-GaP substrate 60 is composed of an Si layer 72 and an Al$_2$O$_3$ layer 73. The thicknesses of the Si layer 72 and the Al$_2$O$_3$ layer are so set as to be λ/4n (n indicates the refractive indices of Si and Al$_2$O$_3$ with respect to the wavelength of light generated in the active layer) with respect to a wavelength λ of light generated in the active layer.

The Si layer 72 and the Al$_2$O$_3$ 73 have a large refractive index difference, and the absorption coefficient of the Si layer 72 having a high refractive index is small. Therefore, the light reflecting layer 69 can achieve high reflectance. However, the Al$_2$O$_3$ layer 68 having a low refractive index has small thermal conductivity and hence deteriorates the thermal characteristics of the element.

Figure 27:
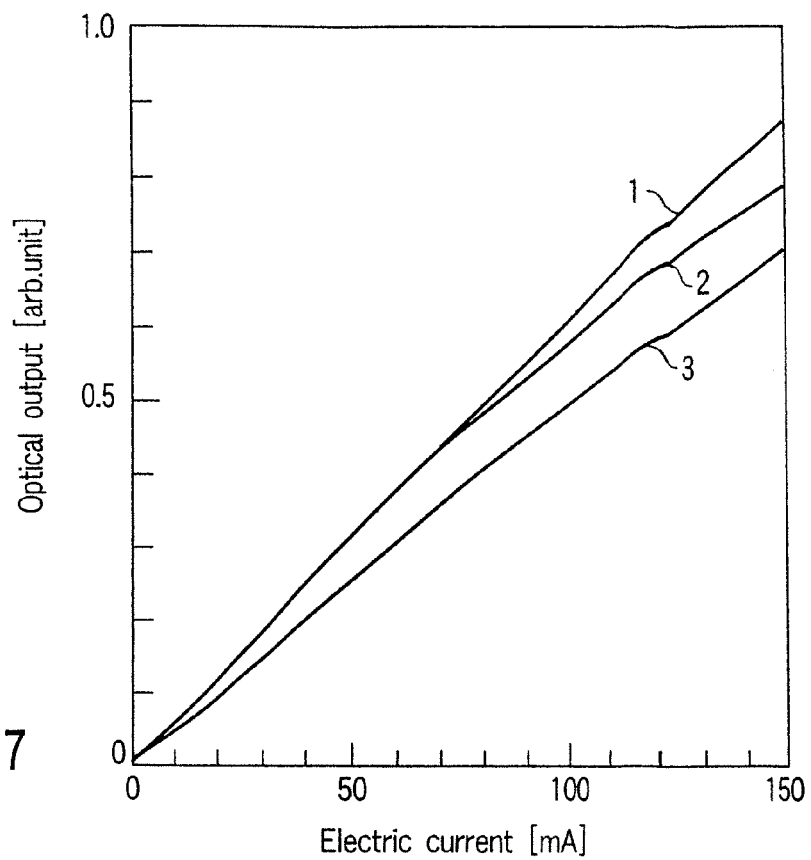
FIG. 27 is a graph showing the relationship between the electric current and optical output of the light emitting element shown in FIG. 21.

FIG. 27 shows the relationship between the electric current and the optical output of the light emitting element shown in FIG. 21.

Referring to FIG. 27, line ① corresponds to the light emitting element shown in FIG. 21; line ②, the light emitting element shown in FIG. 26; and line ③, a conventional light emitting element.

According to this relationship, the light emitting element shown in FIG. 21 is most superior in optical output and durability. The optical output of the light emitting element shown in FIG. 26 saturates when the injection current increases under the influence of low thermal conductivity of Al$_2$O$_3$. However, when the injection current is 150 mA or less, the optical output of this light emitting element shown in FIG. 26 is higher than that of the conventional light emitting element.

When the driving current is 20 mA, the characteristic of the light emitting element shown in FIG. 26 is substantially the same as that of the light emitting element shown in FIG. 21. Accordingly, it is well significant to use the light emitting element of this modification as an LED.

Figure 28:
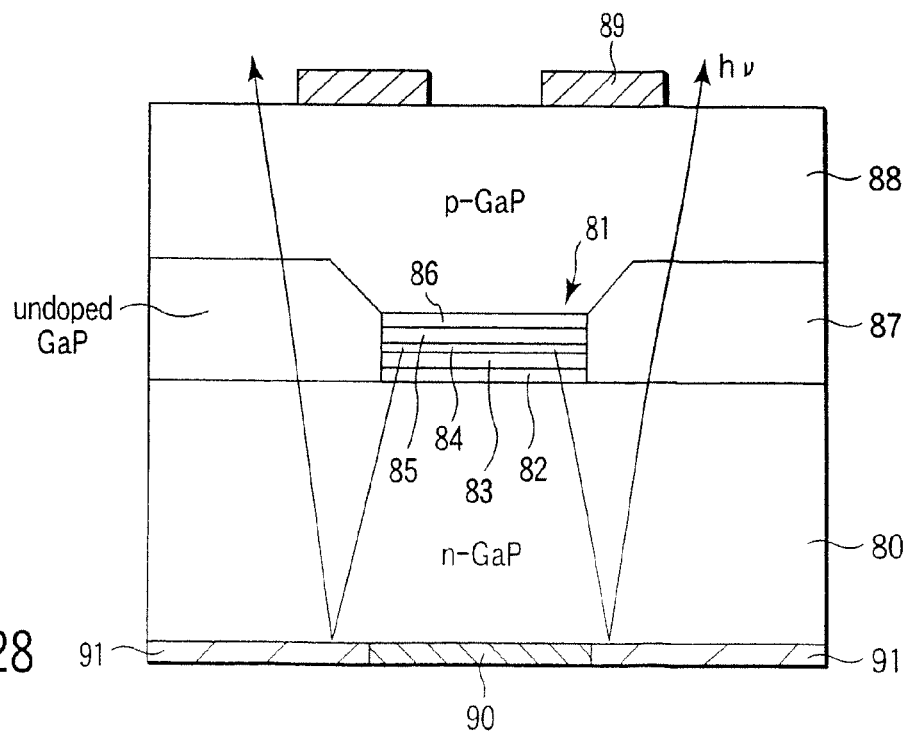
FIG. 28 is a view showing the fifth embodiment of the light emitting element of the present invention.

FIG. 28 shows the fifth embodiment of the light emitting element of the present invention.

This embodiment relates to a light emitting element which generates 620-nm red light in a GaAs light emitting element and a GaP light emitting element.

A light emitting layer 81 is formed on a portion of an n-GaP substrate 80. This light emitting layer 81 includes an n-InGaAlP contact layer 82, an n-InAlP cladding layer 83, an InGaAlP active layer 84, a p-InAlP cladding layer 85, and a p-InGaAlP contact layer 86.

An undoped GaP current limiting layer 87 is formed on the other portion (a region where the light emitting layer 81 is not formed) of the n-GaP substrate 80. A p-GaP layer 88 is formed on the light emitting layer 81 and the undoped GaP current limiting layer 87. A p-side electrode 89 is formed on the p-GaP layer 88. An n-side electrode 90 and a light reflecting layer 91 are formed on the back side of the n-GaP substrate 80.

Note that the n-side electrode 90 is positioned immediately below the light emitting layer 81.

A method of manufacturing the light emitting element shown in FIG. 28 will be described below.

Figure 29:
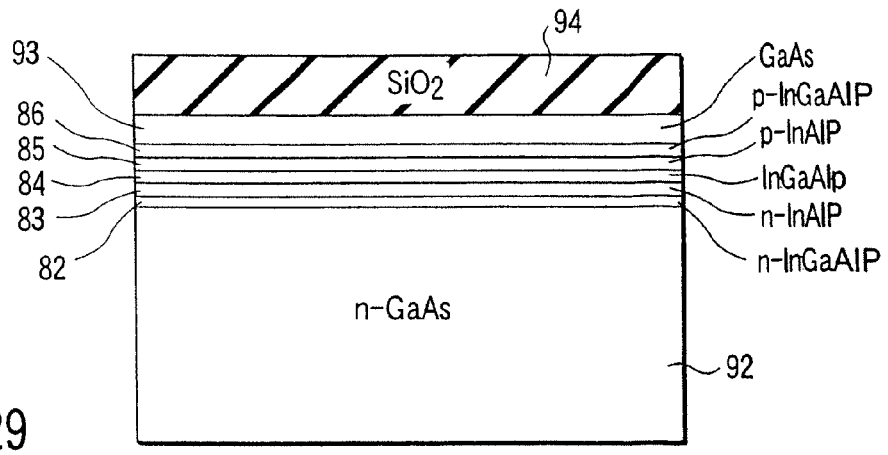
FIG. 29 is a view showing one step of a manufacturing method of the present invention.

First, as shown in FIG. 29, MO-CVD is used to form an n-$In_{0.5}Ga_{0.15}Al_{0.35}P$ contact layer 82, an n-$In_{0.5}Al_{0.5}P$ cladding layer 83, an $In_{0.5}Ga_{0.1}Al_{0.4}P$ active layer 84, a p-$In_{0.5}Al_{0.5}P$ cladding layer 85, and a p-$In_{0.5}Ga_{0.15}Al_{0.35}P$ contact layer 86 in this order on an n-GaAs substrate 92. Subsequently, MO-CVD is used to form an undoped GaAs protective layer 93 and an $SiO_2$ mask layer 94 in this order on the p-$In_{0.5}Ga_{0.15}Al_{0.35}P$ contact layer 86.

Figure 30:
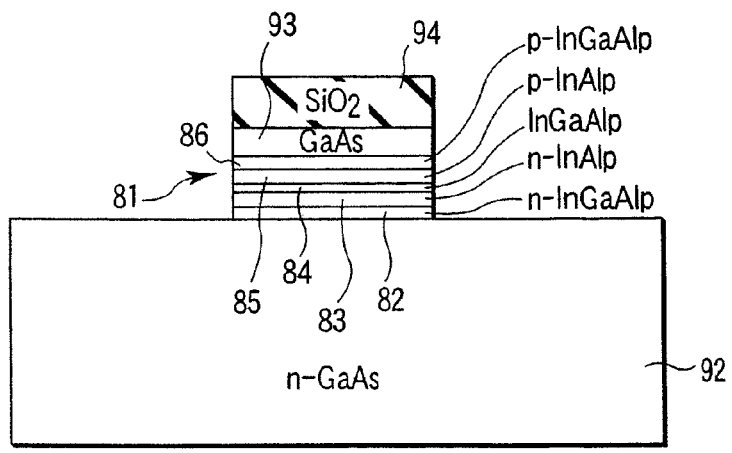
FIG. 30 is a view showing one step of the manufacturing method of the present invention.

Next, as shown in FIG. 30, the $SiO_2$ mask layer 94 is patterned by photolithography and wet etching. This $SiO_2$ mask layer 94 is used as a mask to etch the GaAs protective layer 93, the p-$In_{0.5}Ga_{0.15}Al_{0.35}P$ contact layer 86, the p-$In_{0.5}Al_{0.5}P$ cladding layer 85, the $In_{0.5}Ga_{0.1}Al_{0.4}P$ active layer 84, the n-$In_{0.5}Al_{0.5}P$ cladding layer 83, and the n-$In_{0.5}Ga_{0.15}Al_{0.35}P$ contact layer 82 by RIE, thereby forming a ridge-shaped light emitting layer 81.

Figure 31:
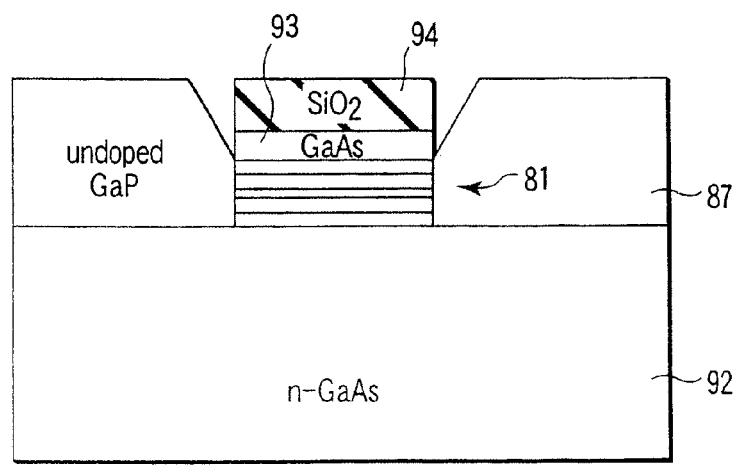
FIG. 31 is a view showing one step of the manufacturing method of the present invention.

As shown in FIG. 31, an undoped GaP current limiting layer 87 is formed on the n-GaAs substrate 92 by CVD.

Figure 32:
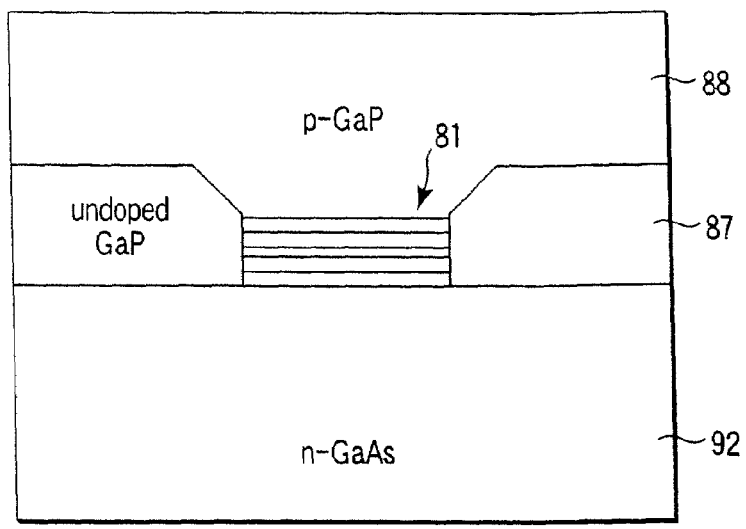
FIG. 32 is a view showing one step of the manufacturing method of the present invention.

As shown in FIG. 32, a p-GaP layer 88 is formed on the light emitting layer 81 and the undoped GaP current limiting layer 87 by CVD. After that, the n-GaAs substrate 92 is entirely etched away to form a device as shown in FIG. 33.

Figure 33:
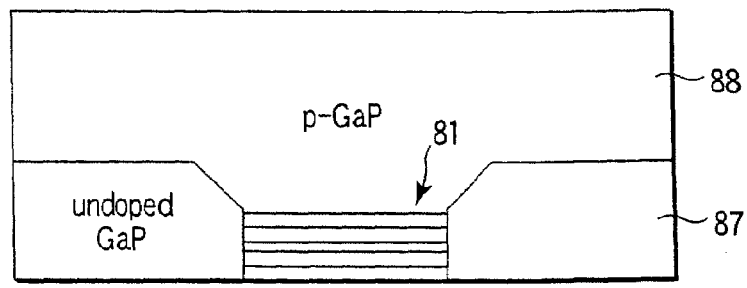
FIG. 33 is a view showing one step of the manufacturing method of the present invention.
Figure 34:
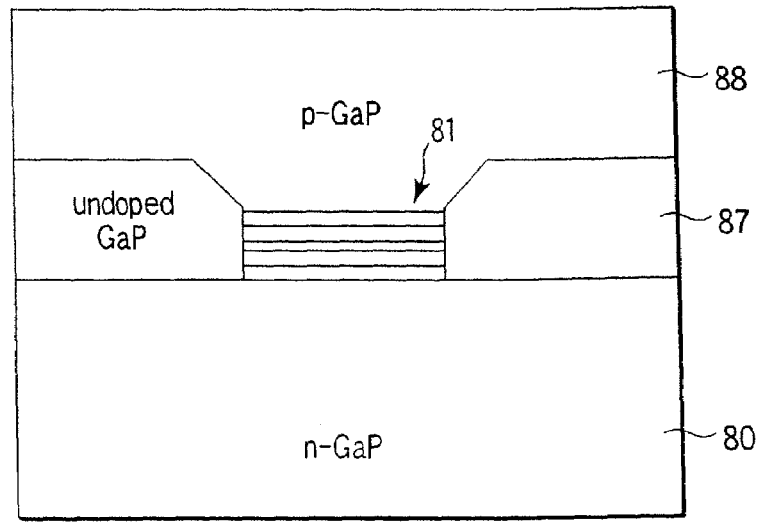
FIG. 34 is a view showing one step of the manufacturing method of the present invention.

As shown in FIG. 34, an n-GaP substrate 80 is bonded to the device shown in FIG. 33.

After that, as shown in FIG. 28, a p-side electrode 89 is formed on the p-GaP layer 88, and an n-side electrode 90 and a light reflecting layer 91 are formed on the back side of the n-GaP substrate 80.

Note that the light emitting layer 81 is positioned in a central portion of the n-GaP substrate 80 (or the chip) and surrounded by the undoped GaP current limiting layer 87.

Of red light generated in the InGaAlP active layer 84 of this light emitting element, light traveling to the p-side electrode is emitted to the outside of the chip through the p-InAlP cladding layer 85, the p-InGaAlP contact layer 86, and the p-GaP layer 88. Of the red light generated in the InGaAlP active layer 84, light heading to the n-GaP substrate 80 is reflected by the light reflecting layer 91 through the n-GaP substrate 80 which is a transparent substrate. This reflected light travels to the p-side electrode and is emitted to the outside of the chip.

In this structure, the n-side electrode 90 is positioned immediately below the InGaAlP active layer 83, and the light reflecting layer 91 is positioned immediately below the GaP current limiting layer 87. That is, light heading to the n-GaP substrate 80 is reflected by the light reflecting layer 91. Consequently, the reflected light is emitted to the outside of the chip through the GaP current limiting layer 87 whose bandgap energy is larger than its emission energy, without passing through the light emitting layer 81.

Since the reflected light does not pass through the light emitting layer 81, this reflected light is not again absorbed by the light emitting layer 81. Accordingly, the light emitting element of this embodiment can achieve sufficiently high light extraction efficiency. For example, when the light emitting element mounted in a package having an emission angle of 10° is operated with a driving current of 20 mA, the optical output is 1.4 times (about 20 cd) that of a conventional light emitting element.

In each of the first, second, and third embodiments of the light emitting element of the present invention, light generated in the active layer and traveling to the p-side electrode is reflected by the internal high-reflection layer of the p-side electrode, so the entire light is extracted to the outside of the chip from the back side of the substrate. In this arrangement, the electrode structure of the p-side electrode includes at least an ohmic layer for an ohmic contact, a barrier layer for preventing diffusion of metal impurities, and a high-reflection layer for reflecting light generated in the active layer with high reflectance.

The barrier layer is made of a high-melting material and prevents interdiffusion of metal atoms caused by heat between the ohmic layer and the high-reflection layer. Also, since the thicknesses of the ohmic layer and barrier layer are made as small as possible, the light absorption loss in these ohmic layer and barrier layer can be minimized. Therefore, in this p-side electrode it is possible to realize an ohmic contact and high light reflectance at the same time and suppress a rise of the operating voltage by heat.

As a consequence, the light emitting element and the semiconductor device using the same according to the present invention can realize high reliability and high performance. When the ohmic layer is made up of a plurality of dots (islands) arranged into arrays, it is possible to realize not only an ohmic contact but also high light extraction efficiency by high reflectance in a region where no ohmic layer exists, because absorption and loss of light can be reduced by the amount of ohmic layer.

In each of the fourth and fifth embodiments of the light emitting element of the present invention, light generated in the active layer and traveling to the substrate is reflected by the light reflecting layer, so the entire light is extracted to the outside of the chip from the surface of the p-GaP layer on the p-side electrode side.

Also, the electrode and the light reflecting layer are alternately arranged on the back side of the substrate. In a region where the electrode is present, scattering and absorption of light occur; in a region where the light reflecting layer is present, light is reflected with high efficiency. Accordingly, the light emitting element of the present invention can increase the light extraction efficiency and improve the performance of both the element and the semiconductor device using the element, compared to conventional light emitting elements.

Furthermore, the light emitting layer is formed in the shape of a ridge and surrounded by a transparent material (undoped GaP). In this structure, an electrode is placed immediately below the light emitting layer, and a light reflecting layer is placed immediately below the transparent material. Consequently, it is possible to prevent an event in which light reflected by the light reflecting layer is again absorbed in the light emitting layer, and to increase the light extraction efficiency.

As has been explained above, the electrode structure of the present invention can realize an ohmic contact and high light reflectance at the same time, and can also prevent interdiffusion of metal atoms between a plurality of layers forming the electrode. This makes it possible to increase the external quantum efficiency of a light emitting element, lower the operating voltage, and improve the reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A light emitting element comprising:
   a substrate;
   a light emitting layer formed on said substrate to emit light, wherein said light emitting layer includes a first semiconductor layer of a first conductivity type, an active layer formed on said first semiconductor layer to emit the light and a second semiconductor layer of a second conductivity type formed on said active layer;
   a first electrode contacting said second semiconductor layer; and
   a second electrode contacting said first semiconductor layer,
   said first electrode comprising:
      an ohmic layer in ohmic contact with said second semiconductor layer;
      a first barrier layer formed on said ohmic layer;
      a light reflecting layer formed on said first barrier layer;
      a second barrier layer formed on said light reflecting layer; and
      an overcoat electrode for mounting formed on said second barrier layer,
      wherein said ohmic layer is made of a plurality of islands arranged into array and each of said plurality of islands has a hemispherical shape.

2. The light emitting element according to claim 1, wherein said ohmic layer comprises a metal including Pt.

3. The light emitting element according to claim 1, wherein said light reflecting layer comprises a metal including Ag.

4. The light emitting element according to claim 1, wherein said first barrier layer comprises a material different from that of said ohmic layer.

5. The light emitting element according to claim 1, wherein said light reflecting layer comprises a material different from that of said overcoat electrode.

6. The light emitting element according to claim 1, wherein said substrate is an insulating substrate.

7. The light emitting element according to claim 6, wherein said substrate is made of a sapphire.

8. The light emitting element according to claim 1, wherein said first semiconductor layer and said second semiconductor layer include Ga.

9. The light emitting element according to claim 1, wherein said first electrode is located at a place which is above the center of said substrate.

10. The light emitting element according to claim 9, wherein said second electrode is located at a place which surrounds said first electrode.

11. A light emitting element comprising:
    a substrate;
    a light emitting layer formed on said substrate to emit light, wherein said light emitting layer includes a first semiconductor layer of a first conductivity type, an active layer formed on said first semiconductor layer to emit the light and a second semiconductor layer of a second conductivity type formed on said active layer;
    a first electrode contacting said second semiconductor layer; and
    a second electrode contacting said substrate,
    said first electrode comprising:
       an ohmic layer in ohmic contact with said second semiconductor layer;
       a first barrier layer formed on said ohmic layer;
       a light reflecting layer formed on said first barrier layer;
       a second barrier layer formed on said light reflecting layer; and
       an overcoat electrode for mounting formed on said second barrier layer,
       wherein said ohmic layer is made of a plurality of islands arranged into array and each of said plurality of islands has a hemispherical shape.

12. The light emitting element according to claim 11, wherein said ohmic layer comprises a metal including Pt.

13. The light emitting element according to claim 11, wherein said light reflecting layer comprises a metal including Ag.

14. The light emitting element according to claim 11, wherein said first barrier layer comprises a material different from that of said ohmic layer.

15. The light emitting element according to claim 11, wherein said light reflecting layer comprises a material different from that of said overcoat electrode.

16. The light emitting element according to claim 11, wherein said substrate is a conductive substrate.

17. The light emitting element according to claim 16, wherein said substrate includes Ga.

18. The light emitting element according to claim 11, wherein said first semiconductor layer and said second semiconductor layer include Ga.

19. The light emitting element according to claim 11, wherein said first electrode is located at a place which is above the center of said substrate.

20. The light emitting element according to claim 19, wherein said second electrode is located at an edge portion of said substrate.

* * * * *